US 7,609,565 B2

(12) United States Patent
Lee

(10) Patent No.: US 7,609,565 B2
(45) Date of Patent: Oct. 27, 2009

(54) EXTERNAL CLOCK TRACKING PIPELINED LATCH SCHEME

(75) Inventor: June Lee, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/330,285

(22) Filed: Dec. 8, 2008

(65) Prior Publication Data

US 2009/0091982 A1 Apr. 9, 2009

Related U.S. Application Data

(63) Continuation of application No. 11/641,586, filed on Dec. 18, 2006, now Pat. No. 7,515,485.

(51) Int. Cl.
*G11C 11/00* (2006.01)
(52) U.S. Cl. .............................. 365/189.05; 365/233.5
(58) Field of Classification Search ............ 365/189.05, 365/233.5
See application file for complete search history.

(56) References Cited

U.S. PATENT DOCUMENTS

| 5,450,574 | A | * | 9/1995 | Madter et al. ............... 713/601 |
| 5,828,896 | A | * | 10/1998 | Caudel et al. ................. 712/33 |
| 5,881,002 | A | | 3/1999 | Hamakawa |
| 6,459,614 | B1 | | 10/2002 | Miwa et al. |
| 2003/0065813 | A1 | | 4/2003 | Ruehle |
| 2008/0144376 | A1 | | 6/2008 | Lee |

OTHER PUBLICATIONS

"Samsung NAND datasheets—Flash Memory, K9XXG08UXA", *Samsung Electronics*, 1-43.
Lee, J., et al., "A 90-nm CMOS 1.8-V 2-Gb NAND flash memory for mass storage applications", *IEEE Journal of Solid-State Circuits*, 38(11), (Nov. 2003), 1934-1942.
Lee, June, et al., "High-performance 1-Gb-NAND flash memory with 0.12-/spl mu/m technology", *IEEE Journal of Solid-State Circuits*, 37(11), (Nov. 2002), 1502-1509.

* cited by examiner

*Primary Examiner*—Michael T Tran
(74) *Attorney, Agent, or Firm*—Schwegman, Lundberg & Woessner, P.A.

(57) ABSTRACT

A flash memory including a first latch having at least one external input to receive at least one command, at least one memory address, and a plurality of data bits, a command decoder coupled to the first latch output; a command latch including a first command latch input, a second command latch input, and a command latch output, the first command latch input to couple to the command decoder output, and the second command latch input to couple to a write command output of an internal clock control generator; and a command register including a first command register input and a second command register input, the first command register input to couple to the command latch output, and the second command register input to couple to an internal latch command output of the internal clock control generator. Additional apparatus, systems, and methods are disclosed.

23 Claims, 7 Drawing Sheets

EXTERNAL CLOCK TRACKING PIPELINED LATCH SCHEME

RELATED APPLICATION

This application is a continuation of U.S. application Ser. No. 11/641,586, filed Dec. 18, 2006, now issued as U.S. Pat. No. 7,515,485, which is incorporated herein its entirely.

TECHNICAL FIELD

Various embodiments described herein relate generally to memory devices, including latching schemes used in conjunction with memory devices.

BACKGROUND

Flash memory devices have developed into a popular source of non-volatile memory for a wide range of electronic applications. Flash memory devices typically use a one-transistor memory cell that enables high memory densities, high reliability, and low power consumption. Program code, system data such as a basic input/output system (BIOS), firmware, and other information can typically be stored in flash memory devices.

Flash memory operations, such as erase and program, are accomplished using complex algorithms composed of many different steps and requiring control over timing, counter, and analog voltages. For example, a program operation is typically a loop of program pulses and program verify operations executed so that the desired value is written and verified with an appropriate voltage margin. The control of the memory portion of a memory device, such as the memory array in a flash memory, may be accomplished by controlling one or more actuator signals coupled to the memory array. As memory array page size increases, the write cycle time tends to dominate the total page programming time. Attempts to reduce the write cycle time may result in missing commands, addresses, and/or data due to reduced internal signal setup time margins.

DETAILED DESCRIPTION

In various memory devices, data to be written to the memory array, or the storage portion of the memory device, may be written as an entire "page" of data, a page being some designated portion of the memory array capable of storing a given number of data bits grouped together and defined to be a page. One way to achieve faster "programming", which is another term for writing data to the memory array of a memory device, is to increase the size of a page, thereby writing more data to the memory array during any one write cycle, wherein the write cycle involves writing a page of data. As the page size in increased, the write cycle time, sometimes represented by "tWC" and representing the time required to actually write the data into the memory array, becomes dominant and comparable to the total page programming time. In order to reduce the write cycle time, a faster clock signal, which controls the rate of receiving and processing data to be written to the memory array, may be used. However, when the tWC time is reduced, the signals such as the command, address, and data signals required to properly write the data to the memory array may be received at a rate faster than these signals can be properly processed.

The external clock tracking pipelined latch scheme addresses the problems of using these faster clock signals by providing a pipelined latch scheme that tracks the eternally provided clock signal. The pipeline latch scheme may include a command latch, an address latch, and a data latch, all coupled to an input latch. The command latch, the address latch, and the data latch provide a storage mechanism for moving serial data signals received at an input latch to these pipelined latches before the next incoming data overwrites the data just received at the input latch. Thus, the scheme is pipelined because the incoming data received by the memory device is pipelined to different latches.

Since the serial data received at the input latch can be received sequentially on each incoming clock cycle, moving the data to the additional latches allows incoming data to be received at rates that exceed the rate at which the data might initially be processed. Thus, a faster clock rate may be used with a pipelined latch scheme without delaying the input of serial data. The data movement and the latching of data into additional latches is controlled using a plurality of internally generated clock signals. These internally generated clock signals can be made to track the external clock signal used to sequentially clock in the serial data. Thus, control of the pipelined latch scheme may be adjusted to coordinate latching the serial data to the rate at which the clock signal is providing the serial data to a memory device for storage into the memory array.

Figure 1:
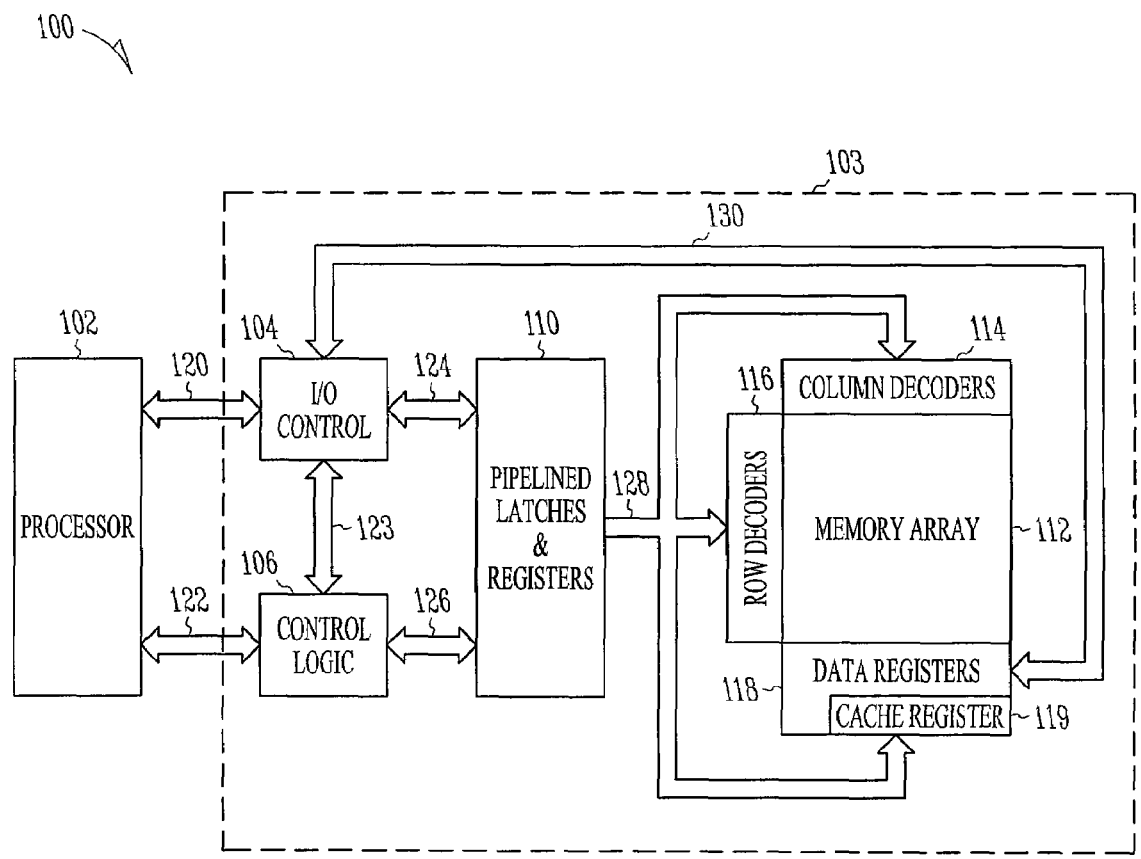
FIG. 1 is a block diagram of a system according to various embodiments of the invention.

FIG. 1 illustrates a functional block diagram of a system 100 according to various embodiments of the invention. System 100 includes a processor 102 and a memory device 103 that includes an I/O control block 104, a control logic block 106, a pipelined latches and registers block 110, and a memory array block 112. In various embodiments, memory array block 112 is a NAND flash memory array, although the various embodiments of the system 100 are not limited to a NAND flash memory array. In various embodiments, memory array block 112 is a NOR flash memory array, although the various embodiments of system 100 are not limited to a NOR flash memory array. Combinations of the two may also be used.

In various embodiments, processor 102 and memory device 103 may be included on a single integrated circuit. In various embodiments, memory device 103 may be included as removable storage such as flash cards and USB Flash drives, and may be included as embedded storage for cell phones, digital cameras, wireless/handheld devices, and MP3 (MPEG-1 Audio Layer-3) players. Various embodiments of memory device 103 include the external clock tracking and the pipelined latch scheme as described herein.

System 100 includes column decoders 114, row decoders 116, and data registers block 118. Column decoders 114 are coupled to memory array 112 and provide column selection signals to memory array block 112. Row decoders 116 are coupled to memory array 112 and provide row selection signals to memory array block 112. Data registers 118 are coupled to memory array block 112. Data registers 118, in various embodiments, include one or more data registers for transferring data to and from memory array block 112. In various embodiments, data registers 118 may include cache registers 119.

In system 100, processor 102 may be coupled to the I/O control block 104 thorough interconnect 120 and the control logic block 106 through interconnect 122. I/O control block 104 may be coupled to control logic block 106 through interconnect 123. Pipelined latches and registers block 110 may be coupled to the I/O control block 104 through interconnect 124 and to the control logic block 106 through interconnect 126. Pipelined latches and registers block 110 may be connected through interconnect 128 to column decoders 114, to row decoders 116, and to data registers 118. In various embodiments, data registers 118, including cache registers 119 if present, may be coupled to I/O control block 104 through interconnect 130.

Interconnects 120, 122, 123, 124, 126, 128, and 130 are not limited to any particular type of interconnects. In various embodiments, one or more of these interconnects may include a plurality of individual conductors operating in parallel to transfer data. Serial connections may also be made. In various embodiments, one or more of these interconnects may include a wireless interconnect. Interconnects 120, 122, 123, 124, 126, 128, and 130 are not limited to being the same type of interconnects, and system 100 may include a variety of types for use in providing interconnects 120, 122, 123, 124, 126, 128, and 130, perhaps used in combination.

In operation, processor 102 provides a plurality of control signals through interconnect 122 to control logic block 106 to control operations performed on memory array 112. Operations the processor performs in controlling memory array 112 include, but are not limited to, reading data from memory array 112, writing data to memory array 112, and erasing one or more portions of memory array 112. In various embodiments, memory array 112 is divided into sections called pages 113. Each page of memory array 112 includes a number of memory bytes, for example 2 kilobytes of memory plus 64 bytes of memory bits. In various embodiments, the operations performed by the processor 102, for example a write operation to the memory array 112, are performed on an entire page 113 of the memory array 112 each time the operation is performed. In order to perform such an operation, processor 102 provides to I/O control block 104 a series of command signals, address signals, and data signals through interconnect 120, wherein the command signals, the address signals, and the data signals are all used in performing the write operation.

In various embodiments, the command signals, the address signals, and the data signals may be sent as a series of serial bytes from the processor 102 though interconnect 120 to I/O control block 104 and are latched into latches included in the pipelined latches and registers block 110. In various embodiments, the command signals may be decoded and provided to the control logic block 106 for the control logic block 106 to generate internal signals for controlling the operation being performed on memory array 112. Further, the address signals may be latched into pipelined latches and registers block 110, and provided to the column decoder 114 and to the row decoder 116 to control the page 113 of memory array 112 on which an operation is being performed. Data signals are latched into registers of pipelined latches and registers block 110 and are provided to data registers 118, for example, during write operations to memory array 112.

During operations on memory array 112, the processor 102 may also provide one or more control signals through interconnect 122 to control logic block 106. These control signals are provided and coordinated with the signals provided by processor 102 to the I/O control block 104 to control the operations performed on memory array 112. In addition, control logic block 106 may provide one or more internally generated control signals, as described in greater detail below, to I/O control block 104 and to pipelined latches and registers block 110 to control the operations performed on memory array 112.

To achieve faster memory array programming, including arrays such as memory array 112 of system 100, the design trend is to increase the size of the page 113. In other words, to increase the number of memory bits included in a page 113. The increase in page size increases the total time required to perform a write operation to memory since a write operation includes writing to an entire page, and the size of any given page is increased. In addition, faster programming times, not longer programming times, are desirable. To provide faster programming times, the cycle times for each signal (for example the command signals, the address signals, and the data signals), as provided from the processor 102 to the I/O control block 104 as an input signal, may be reduced in an effort to provide all the required signals in a reduced overall amount of time.

However, as the programming cycle time is reduced, the time required to process the decoding of the command signal before the command signal is removed from the data input to the memory device 103 and replaced by the next set of incoming information, for example the address data from the processor, begins to exceed the time the command signal is available at the inputs of the memory device. In addition, as the cycle time is reduced, the time available to process the address data and to provide the address data to the column decoders and the row decoders in conjunction with the proper data associated with the address begins to exceed the cycle time during which the address signals are provided at the data input to the memory device 103.

System 100 addresses these challenges by providing pipelined latches and registers block 110, and the control block 106, operating as described in further detail below. Pipelined latches and registers block 110 provides a pipelined latch scheme for latching the command signals, the address signals, and the data signals. By providing a pipelined latch scheme, system 100 may be operable to receive the command signals, the address signals, and the data signals within a reduced cycle time while still being able to perform command decoding and the address decoding operations in time to write data to memory array 112 without causing undue delay.

In addition, control logic block 106 provides internal signals that track externally provided control signals from the processor. Thus system 100 is able to control the latches of the pipelined latches and registers block 110 using these internally generated signals. Control of the latches using internally generated signals allows further reduction of the cycle time while properly performing write operations to the memory array 112. In various embodiments, the clock cycle time for externally clocking the data into memory device 103 from processor 102 may be reduced to 10 nanoseconds or less.

In some embodiments, the system 100 may comprise a personal digital assistant 101, a camera 105, or a cellular telephone 107, with the processor 102 coupled to a display 109.

Figure 2:
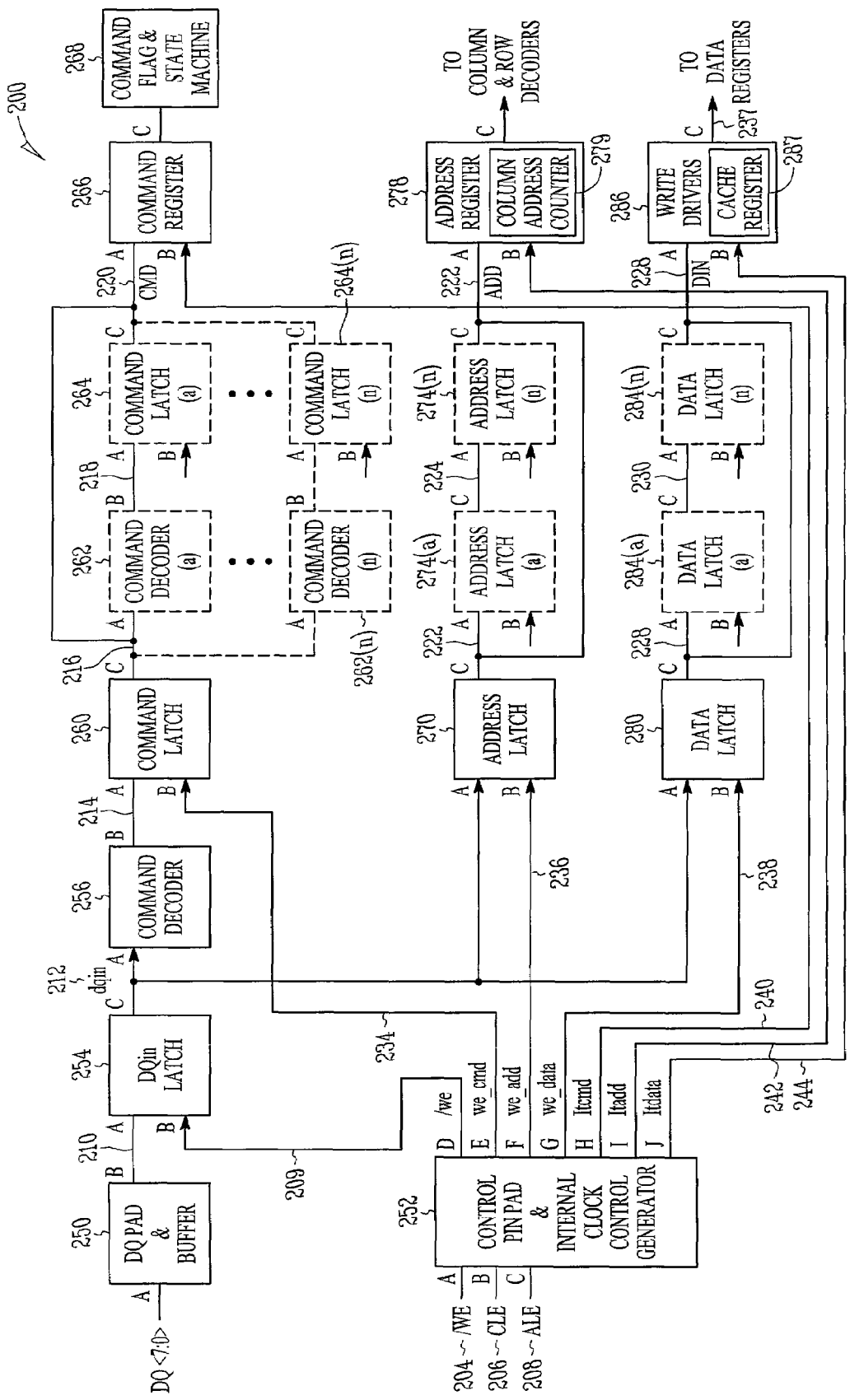
FIG. 2 is a functional block diagram of an apparatus according to various embodiments of the invention.

FIG. 2 is a functional block diagram of an apparatus 200 according to various embodiments of the invention, including a pipelined latch scheme. FIG. 2 illustrates various functional blocks including, for example, blocks 250, 254, and 256, coupled by connections 210 and 212. The functional blocks as represented in FIG. 2 are not limited to any particular type of device or any particular type of circuit. Any devices or circuits capable of performing the functions described may be used to implement the functional blocks and circuitry shown in FIG. 2. Further, connections shown in FIG. 2 are not limited to any particular type of connections. In various embodiments, the connections shown in FIG. 2 are actual physical connections. In various embodiments, the connections shown in FIG. 2 may represent a single physical conductor, or a plurality of conductors, or a bus, or a transmission line. In various embodiments, the connections shown in FIG. 2 may represent functional blocks that are communicatively coupled, but that are not necessarily physically coupled by an actual physical connection, as shown by the representative lines of the connections as depicted in FIG. 2.

The apparatus 200 includes control pin pad and internal clock control generator (ICCG) 252. ICCG 252 is coupled to receive the /WE signal 204, the CLE signal 206, and the ALE signal 208 at inputs 252a, 252b, and 252c respectively. ICCG 252 provides a /we signal 209 at the 252d output, a we_cmd signal 234 at the 252e output, a we_add signal 236 at the 252f output, a we_data signal 238 at the 252g output, an ltcmd signal 240 at the 252h output, an ltadd signal 242 at the 252i output, and an ltdata signal 244 at the 252j output.

The apparatus 200 includes DQ pad 250 having an input 250a and an output 250b. In various embodiments, DQ pad 250 includes one or more buffers, and may be coupled to receive the DQ<7:0> signal 202 at an input 250a. While the DQ<7:0> signal is shown as including eight bits, specifically bits 0 to 7, the DQ<7:0> signal 202 is not limited to any particular number of bits. In various embodiments, the DQ<7:0> signal 202 may include more or less than eight bits, including but not limited to 16, 32, or 64 bits.

DQ pad 250 is coupled to connection 210 at output 250b. Connection 210 is coupled to input 254a of DQin latch 254. DQin latch 254 is coupled to receive the /we signal 209 at input 254b, and is coupled to connection 212 at output 254c. Connection 212 is also referred to as providing the "dqin" signal in block diagram 200.

The apparatus 200 includes command decoder 256, command latch 260, and command register 266. Command decoder 256 includes input 256a and output 256b. Input 256a is coupled to connection 212 (dqin). Output 256b is coupled to connection 214.

Command latch 260 includes input 260a, input 260b, and output 260c. Input 260a is coupled to connection 214, and input 260b is coupled to receive the we_cmd signal 234. Output 260c is coupled to connection 216.

Command register 266 includes input 266a, input 266b, and output 266c. In various embodiments, input 266a is coupled to connection 216. Input 266b is coupled to receive ltcmd signal 240. In various embodiments, the output signal provided by any of the command latches in block diagram 200 as an input to command register 266 at input 266a is referred to as the "CMD signal 320" as further described in conjunction with FIG. 3.

In various embodiments, the apparatus 200 includes an additional command decoder 262 including input 262a and output 262b, and additional command latch 264, including input 264a, input 264b, and output 264c. In various embodiments, input 262a is coupled to connection 216, output 262b is coupled to connection 218, input 264a is coupled to connection 218, input 264b is coupled to we_cmd signals 234, and output 264c is coupled to connection 220.

In various embodiments, additional command decoder 262 receives partially decoded commands from command latch 260, and further processes the decoding of the partially decoded commands before providing the fully processed (decoded) commands to additional command latch 264. In various embodiments, additional command decoder 262 includes a plurality of command decoders 262(a-n) and a plurality of additional command latches 264(a-n) coupled to command latch 260 and command register 266. In embodiments including additional command decoders and additional command latches, the command decoders may operate either in a serial or in a parallel fashion. When operating in a serial fashion, an additional command decoder receives a partially decoded command and provides additional decoding of the command. When operating in a parallel fashion, one or more of the additional command decoders will receive a portion of a command and will provided decoding of the portion of the command received.

It should be understood that various combinations of serial and parallel command decoding and latching can be achieved, and embodiments of the invention are not limited to any particular arrangement of command decoders and command latches, including the arrangement shown in FIG. 2.

In embodiments that include the additional command latches 264(a-n), one or more of the additional command latches may include an input b coupled to receive a we_cmd signal 234 for controlling the operation of the additional command latches 264(a-n). The we_cmd signal 234 may include a plurality of individually controllable signals coupled to each of an input b's of each of the additional command latches, and be used for individually controlling the latching operation of each of the additional command latches.

Command register 266 receives the decoded commands from one or more of the command latches and provides the decoded commands to control logic, including but not limited to, the control logic block 106 of FIG. 1. In various embodiments, command register 266 provides the decoded commands to a command flag and state machine 267.

The apparatus 200 includes address latch 270 and address register 278. Address latch 270 includes input 270a, input 270b, and output 270c. Input 270a is coupled to connection 212 (dqin), and input 270b is coupled to we_add signal 236. Output 270c is coupled to connection 222.

Address register 278 includes input 278a, input 278b, and output 278c. Input 278b is coupled to ltadd signal 242, and output 278c is coupled to the column decoders and the row decoders associated with the memory array. In various embodiments, input 278a is coupled to connection 222.

In various embodiments, the apparatus 200 includes additional address latches 274(a-n). Each of the additional address latches 274(a-n) includes an input a, an input b, and an output c. In various embodiments, the additional address latches 274(a-n) are used to latch one or more portions of an address being provided at the DQ pad 250 as these portions of the address are latched into DQin latch 254 and are provided at connection 212 (dqin). In various embodiments that include the additional address latches 274(a-n), the addition address latches may operate in a serial fashion, wherein a first one of the additional address latches receives an address provided at the 270c output from address latch 270. In various embodiments, additional latches 274(a-n) may operate in a parallel fashion, wherein each of additional address latches 274(a-n) is coupled to connection 212 and receives a particular portion of an address being provided at the connection 212 (dqin).

In some embodiments, one or more of the additional address latches 274(a-n) includes an input b coupled to receive a we_add signal 236 for controlling the operation of the additional address latches 274(*a-n*). In various embodiments that include the additional address latches 274(*a-n*), the we_add signal 236 may include a plurality of individually controllable signals coupled to each of an input b's of each of the additional address latches, and used for individually controlling the latching operation of each of the additional address latches.

Address register 278 receives the address data from one or more of the address latches and provides the latched address to the column decoders and row decoders associated with the memory array. In various embodiments, address register 278 provides the latched address data to the control logic block, such as control logic block 106 of FIG. 1, for decoding of the address data and for timing the application of the address data to the memory array. In various embodiments, address register 278 includes a column address counter 279.

The apparatus 200 includes data latch 280 and write drivers 286. In various embodiments, write drivers 286 include cache registers 287. In various embodiments, cache registers 287 may be cache register 119 as shown in FIG. 1. Returning to FIG. 2, data latch 280 includes input 280*a*, input 280*b*, and output 280*c*. Input 280*a* is coupled to connection 212 (dqin), and input 280*b* is coupled to the we_data signal 238. Output 280*c* is coupled to connection 228.

Write drivers 286 include input 286*a*, input 286*b*, and output 286*c*. Input 286*b* is coupled to ltdata signal 244, and output 286*c* is coupled to the data registers associated with the memory array, for example, memory array 112 of FIG. 1. In various embodiments, input 286*a* is coupled to connection 228. In various embodiments, data write drivers 286 is coupled to column address counter 279 by connection 288 at input 286*d* of data write drivers 286 and output 278*d* of address register 278.

In some embodiments, the apparatus 200 includes additional data latches 284(*a-n*). Each of the additional data latches may include an input a, an input b, and an output c. In various embodiments, the additional data latches 284(*a-n*) are used to latch one or more portions of data to be written to the memory array as provided at the DQ pad 250 as these portions of the data are latched into DQin latch 254 and are provided at connection 212 (dqin). The additional data latches 284(*a-n*) may operate in a serial fashion, wherein a first one of the additional data latches receives data provided at the 280*c* output from data latch 280. In various embodiments, additional data latches 284(*a-n*) may operate in a parallel fashion, wherein one or more of additional data latches 284(*a-n*) are coupled to connection 212 and receives a particular portion of the data being provided at the connection 212 (dqin).

In some embodiments, the additional data latches 284(*a-n*) include an input b coupled to receive a we_data signal 238 for controlling the operation of the additional data latches 284(*a-n*). The we_data signal 238 may include a plurality of individually controllable signals coupled to each of an input b of each of the additional data latches and used for individually controlling the latching operation of each of the additional data latches.

In operation, the apparatus 200 may receive control signals, such as the /WE signal 204, the CLE signal 206, and the ALE signal 208 at ICCG 252 from an external source. The external source may comprise, for example, the processor 102 of FIG. 1. The externally supplied signals may indicate that a write operation is to be performed on the memory array. In such instances, a series of data, including but not limited to, a series of eight-bit bytes of data, may be received at DQ pad 250. The series of data may include command signals, address signals, and data that is to be written to the memory array. As the information is received, ICCG 252 receives external control signals and, based on the received external control signals, generates various internally generated control signals such as we_cmd signal 234, we_add signal 236, we_data signal 238, ltcmd signal 240, ltadd signal 242, and ltdata signal 244. These internal signals will be tracking at least one of the externally supplied control signals, including but not limited to, the /WE signal 204. By tracking the externally supplied signals, ICCG 252 generates the internally generated signals at the proper time and in the proper sequence so as to control the command latch 260, the address latch 270, the data latch 280, and the command register 266, the address register 278, and the write drivers 286 to write the data to the memory array. When accomplished successfully, the internally generated signals provide this control without causing delay in the cycle time rate of the command signals, the address signals, and the data signals as provided to DQ pad 250.

It should be understood that some embodiments may not include the DQin latch 254 and command decoder 265, in which case the incoming commands, addressees, and data may be latched directly into the respective command latch, address latch and data latch as shown in FIG. 2. In some embodiments, the we_cmd signal 234 may be used to directly latch commands into command latch 260, the we_add signal 236 may be used to directly latch addresses into address latch 270, and the we_data signal 238 may be used to directly latch data into data latch 280. In various embodiments, decoding of the commands directly latched into command latch 260 may be decoded by downstream decoders, such as decoder 262 and decoders 262(*a-n*).

Figure 3:
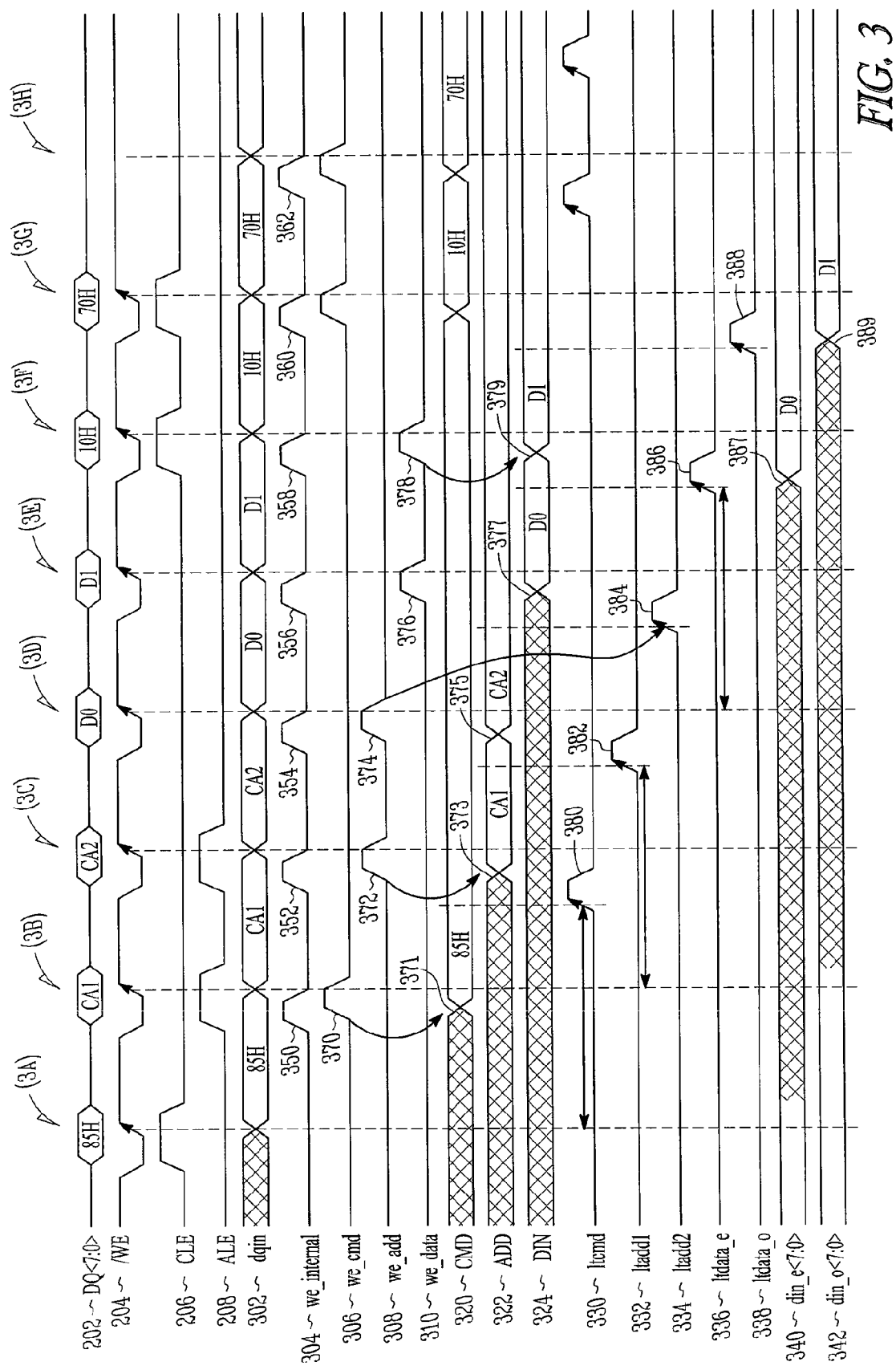
FIG. 3 is a timing diagram of waveforms according to various embodiments of the invention.

A further explanation of the operation of the apparatus 200 is provided in conjunction with a discussion of FIG. 3. FIG. 3 illustrates a timing diagram 300 for one or more example embodiments of the pipelined latch scheme of the invention including, but not limited to, the pipelined latch scheme of FIG. 2. Included in timing diagram 300 are externally supplied signals, such as the DQ<7:0> signal 202, the /WE signal 204, the CLE signal 206, and the ALE signal 208 inputs. Further included are the signals present at the dqin signal 302, representative for example of the signals present at the output of the DQin latch 254 as shown in FIG. 2. Timing diagram 300 also includes a representation of we_internal signal 304, which is the internal clock signal generated by the ICCG 252, tracking the externally received /WE signal 204, as further described below.

Also included in timing diagram 300 are signals generated by ICCG 252, including the we_internal signal 304, we_cmd signal 306, the we_add signal 308, the we_data signal 310, the ltcmd signal 330, the ltadd1 signal 332 and the ltadd2 signal 334 (representative of signals on the ltadd signal 242 as shown in FIG. 2), the ltdata_e signal 336, and the ltdata_o signal 338 (representative of signals on the ltdata signal 244 as shown in FIG. 2).

Also included in timing diagram 300 are representations of the outputs provided from the command latch 260, the address latch 270, and the data latch 280 of FIG. 2. The command latch 260 output is represented by the CMD signal 320, the address latch 270 output is represented by the ADD signal 322, and the data latch 280 output is represented by the DIN signal 324. In various embodiments including additional command latches, additional address latches, or additional data latches, the CMD, ADD, and DIN signals may be provided by one or more of these additional latches as they are coupled to their respective CMD, ADD, and DIN connection nodes.

Representations of data written to the memory array data registers and provided as outputs from the write drivers 286 and shown by way of example in FIG. 2 are included in timing diagram 300 as the din_e,<7:0> signal 340 and the din_o<7:0> signal 342.

Timing diagram 300 includes a plurality of time periods represented by the phases (3a), (3b), (3c), (3d), (3e), (3f), (3g), and (3h). These phases represent the time during and surrounding consecutive transitions of the /WE signal 204 from a low to a high state. The "/" included in the representation of "/WE signal 204" indicates that the second part, or the trailing edge of the /WE signal 204, is the portion of the signal used to indicate a clock signal has occurred. These indications that a clock signal has occurred are represented by the time periods represented by the phases (3a), (3b), (3c), (3d), (3e), (3f), (3g), and (3h) in timing diagram 300.

Embodiments of the invention are not limited to using the backside, or a low to high transition, of the /WE signal 204 to indicate a clock signal. In various embodiments, a transition of the externally supplied /WE signal 204 may use a high to low transition to indicate that a clock signal has occurred. In various embodiments, the leading edge of the /WE signal 204 may be used to indicate that a clock signal has occurred.

Considering now FIGS. 2 and 3, it can be seen that at time period (3a), a command signal represented by "85H" is provided as an externally supplied signal on DQ<7:0> signal 202, and a trailing edge transition is provided on /WE signal 204. The representation of "85H" is determined to be a command signal because of the high state of the CLE signal 206 present during trailing edge transition of the /WE signal 204. The trailing edge transition on /WE signal 204 causes the "85H" command to be latched and provided as the dqin signal 302. This is because the /we signal 209 in FIG. 2 is provided to DQin latch 254 at input 254b by ICCG 252.

At some time following time period (3a) and before time period (3b), the "85H" command is no longer provided on the DQ<7:0> signal 202. However, because the "85H" command is now latched and is provided as the dqin signal 302, the disappearance of the "85H" command from the DQ<7:0> signal 202 does not limit the time during which the "85H" command may be operated on by an apparatus or a system including the pipelined scheme as described herein.

The trailing edge transition of the /WE signal 204 also causes the generation of a pulse 350 on the we_internal signal 304 during a time after time period (3a) but before the next trailing edge transition of the /WE signal 204 at time period (3b). Timing diagram 300 illustrates pulse 350 as occurring just before time period (3b). In addition, because the /WE signal 204 transition at time period (3a) occurs when the CLE signal 206 is high, the signal provided on the DQ<7:0> signal 202 is determined to be a command signal. Therefore, a pulse 370 is also generated on the we_cmd signal 306, wherein at least the leading edge of pulse 370 occurs before time period (3b). Pulse 370 provides the enable signal to a command latch, including but not limited to the command latch 260 as shown in FIG. 2, causing the "85H" command provided on the dqin signal 302 to be latched into a latch providing the CMD signal 320 output. This is represented in timing diagram 300 by inflection point 371. Because the "85H" command is latched into at least one command latch, as represented by inflection point 371, prior to time period (3b), the replacement of the "85H" command at time period (3b) does not limit the time during which the "85H" command may be processed by an apparatus or a system that includes the pipelined scheme as described herein. As opposed to an apparatus of a system that does not include the command latch and the pipelined scheme, the "85H" command remains available even after time period (3b) in timing diagram 300, wherein at time period (3b) the "85H" command has been replaced as the dqin signal 302, but remains available at the CMD signal 320.

In addition to the pulse 370 on the we_cmd signal 306, a pulse 380 is generated on the ltcmd signal 330. In various embodiments, pulse 380 may be generated as a one shot pulse from the falling edge of the we_cmd signal 306, with some delay to adjust for internal set up and hold time related to the command latch providing the CMD signal 320. In timing diagram 300, pulse 380 occurs at some time period following pulse 370 and time period (3b), but before time period (3c). The generation of pulse 380 causes the "85H" signal provided by CMD signal 320 to be latched into a command register, including but not limited to, the command register 266 as shown in FIG. 2.

As shown, pulse 380 causes the "85H" command to be latched into the command register between 1.5 and 2 cycles after the "85H" command was first provided as a signal on the dqin signal 302. As also illustrated by timing diagram 300, the "85H" command was latched into the command register at a time past a time when the "85H" command was no longer available as an output on the dqin signal 302. In other words, the time period for latching the "85H" command into the command register following the "85H" command becoming available at the dqin signal 302 is longer than the time period between time period (3a) and time period (3b) representing the cycle time of the /WE signal 204.

One benefit of this longer time period between the time a command, such as the "85H" command, is available at the dqin signal 302 and the time the command is actually latched into the command register is that more decoding time is available for decoding the command provided at the dqin signal 302 before the decoded command is latched into the command register. By not being restricted to decoding the command with a single clock cycle of the externally supplied clock (/WE signal 204), the cycle time of the externally supplied clock can be reduced to a time less than the time required to decode the command signals. This is generally not possible in systems where the input latch receiving the command is not pipelined into a command latch before being latched into the command register, because the command at the input latch is only provided for a single clock cycle, and then is replaced by the next input data (address CA1 shown in timing diagram 300) on the next cycle of the externally supplied clock signal. If the command in a single latch apparatus is not decoded by the time of the next externally supplied clock cycle, the command will be replaced by the next incoming data, and thus is no longer available to be fully decoded by the system before being passed onto the command register. Thus, a system that includes the input latch coupled to the command register without the command latch and the pipelined scheme described herein generally completes the decoding of the command within one cycle of the externally supplied clock signal. Since some amount of time is used to perform the decoding, this sets a maximum clock rate at which the externally supplied clock signal can operate, and thus sets a minimum amount of time consumed by a write sequence to the memory registers.

Embodiments including at least one command register are capable of latching commands received at the input latch into a second latch, and then continuing to decode the command even after the command has been replaced at the input latch by the next incoming information. Therefore, embodiments including at least one command latch may operate at faster clock rates of the externally supplied clock signal, including rates where the decoding time of the command signals exceeds the time period for one complete cycle of the externally supplied clock signal.

Even at the time when pulse 380 occurs, the "85H" command may still be provided by the CMD signal 320. Because the "85H" command is still available, pulse 380 could be delayed for a period of time even longer than that illustrated in timing diagram 300, enabling the "85H" command to be latched into the command register. For example the "85H" command could be latched at a time following time period (3c), since the "85H" command is still available at the CMD signal 320.

The additional time provided by the command latching scheme may also be used to process the command using additional decoders 262(a-n) as shown in FIG. 2. The additional decoders 262(a-n) may be coupled to additional command latches 264(a-n). The outputs from the additional decoders 262(a-n) may be latched into additional command latches 264(a-n) using additional pulse signals that may be provided as part of the we_cmd signal 234.

At time period (3b) in timing diagram 300 an address signal represented by "CA1" is provided as an externally supplied signal on DQ<7:0> signal 202, and a trailing edge transition is provided on /WEe signal 204. The trailing edge transition on /WE signal 204 causes the "CA1" address to be latched and to be provided as the dqin signal 302. The latching of the "CA1" address causes the "85H" command that was previously latched and previously provided as the dqin signal 302 to be replaced by the "CA1" address. However, because the "85H" command is now latched into at least one command latch as described above, the disappearance of the "85H" command from the dqin signal 302 does not limit the time during which the "85H" command may be operated on by an apparatus or a system including the command latch and the pipelined scheme.

The trailing edge transition of the /WE signal 204 also causes the generation of a pulse 352 on the we_internal signal 304 during a time after time period (3b) but before the next trailing edge transition of the /WE signal 204 at time period (3c). Timing diagram 300 illustrates pulse 352 as occurring just before time period (3c). In addition, because the /WE signal 204 transition occurring at time period (3b) occurs when the ALE signal 208 is high, the signal provided on the DQ<7:0> signal 202 is determined to be an address signal. Therefore, a pulse 372 is also generated on the we_add signal 308, wherein at least the leading edge of pulse 372 occurs before time period (3c). Pulse 372 provides the enable signal to an address latch, including but not limited to, the address latch 270 as shown in FIG. 2, causing the "CA1" address provided on the dqin signal 302 to be latched into a latch providing the ADD signal 322 output. This is represented in timing diagram 300 by inflection point 373. Because the "CA1" command is latched into at least one address latch, as represented by inflection point 373 prior to time period (3c), the replacement of the "CA1" address at time period (3c) reduces limitations on the time during which the "CA1" address may be operated on by an apparatus or a system including the pipelined scheme as described herein.

At some time between time periods (3c) and (3d), a pulse, represented by pulse 382, is generated on the ltadd1 signal 332. Pulse 382 causes address "CA1" to be provided to an address register, for example address register 278 in FIG. 2, between 1.5 and 2 cycles after the "CA1" address was first available as the dqin signal 302.

At time period (3c) in timing diagram 300, an address signal represented by "CA2" is provided as an externally supplied signal on DQ<7:0> signal 202, and a trailing edge transition is provided on /WE signal 204. The trailing edge transition on /WE signal 204 causes the "CA2" address to be latched and to be provided as the dqin signal 302. The latching of the "CA2" address causes the "CA1" address that was previously latched and previously provided as the dqin signal 302 to be replaced by the "CA2" address. However, because the "CA1" address is now latched into at least one address latch as described above, the disappearance of the "CA1" address from the DQ<7:0> signal 202 reduces limitations on the time during which the "CA1" address may be operated on by an apparatus or a system including the address latch and the pipelined scheme.

In a process similar to that described above for the "CA1" address, the "CA2" address is processed by the generation of a pulse 354 on the we_internal signal 304 during a time after time period (3c) but before the next trailing edge transition of the /WE signal 204 at time period (3d), generating a pulse 374 on the we_add signal 308 wherein at least the leading edge of pulse 374 occurs before time period (3d), and causing the "CA2" address to be latched into a latch providing the ADD signal 322 output as represented in timing diagram 300 by inflection point 375. At some time between time periods (3d) and (3e), a pulse, represented by pulse 384, is generated on the ltadd2 signal 334. Pulse 384 causes address "CA2" to be provided to an address register, for example address register 278 in FIG. 2, between about 1.5 and 2 cycles after the "CA2" address was first available as the dqin signal 302.

In various embodiments, following the address cycles, an initial (starting) column address may be set in the column address counter 279. The processing of the incoming data may occur using two operations. In a first operation, data loading occurs wherein incoming data is loaded to the cache registers 287 one by one according to column address, as determined by the column address provided by the column address counter 279. As each cycle of data is then received (for example 8 bits or 16 bits), and loaded into the cache registers 287, the column address in the column address counter 279 is incremented. This allows the incoming data to be serially loaded into a series of location in the cache registers 287, addressed by consecutive column addresses provided by column address counter 279. The setting from the column address counter 279 may be provided to the data cache register using, for example, connection 288.

In a second operation, which may be referred to as data programming, the data that has been loaded into the cache registers 287 is transferred (programmed) into locations in the memory array, the locations in the memory array being determined by row addresses selected at the time the data is being programmed. By providing the cache registers 287 with these incremental column addresses and row addresses, the cache registers 287 will write the data provided on each consecutive data write cycle to consecutively addressed column addresses in the memory array.

At time period (3d) in timing diagram 300, a data byte represented by "D0" is provided as an externally supplied signal on DQ<7:0> signal 202, and a trailing edge transition is provided on /WE signal 204. The data byte provided at time period (3d) is recognized as data to be stored into the memory array because both the CLE signal 206 and the ALE signal 208 are low during this trailing edge transient on the /WE signal 204.

The trailing edge transition on /WE signal 204 causes the "D0" data to be latched and to be provided as the dqin signal 302. The latching of the "D0" data causes the "CA2" address that was previously latched and previously provided as the dqin signal 302 to be replaced by the "D0" data. However, because the "CA2" address is now latched into at least one address latch as described previously, the disappearance of the "CA2" address from the dqin signal 302 reduces limitations on the time during which the "CA2" address may be operated on by an apparatus or a system including the address latch and the pipelined scheme.

Data "D0" is not limited to any particular type of data, or to any particular number of bits used to represent the data. In timing diagram 300, the DQ<7:0> signal 202 represents an eight bit data input, including bits 0 through 7. Data "D0" is labeled in timing diagram 300 as the "Bottom" or the least significant data portion of a larger input of data. However, various embodiments may include any number of data bits included in "D0" based on the number of data inputs available in the DQ<7:0> signal 202. Other embodiments may include 16 bit, 32 bit, and 64 bit data, i.e. 2' bits of data where n is greater than zero and typically greater than four.

The trailing edge transition of the /WE signal 204 also causes the generation of a pulse 356 on the we_internal signal 304 during a time after time period (3d) but before the next trailing edge transition of the /WE signal 204 at time period (3e). Timing diagram 300 illustrates pulse 356 as occurring just before time period (3e). A pulse 376 is also generated on the we_data signal 310, wherein at least the leading edge of pulse 376 occurs before time period (3e). Pulse 376 provides the enable signal to a data latch, including but not limited to, the data latch 280 as shown in FIG. 2, causing the "D0" data provided on the dqin signal 302 to be latched into a latch providing the DIN signal 324 output. This is represented in timing diagram 300 by inflection point 377. Because the "D0" data is latched into at least one data latch, as represented by inflection point 377 prior to time period (3e), the replacement of the "D0" data at time period (3e) reduces limitations on the time during which the "D0" data may be operated on by an apparatus or a system including the pipelined scheme as described herein.

At some time between time periods (3e) and (3f), a pulse, represented by pulse 386, is generated on the ltdata_e signal 336. Pulse 386 causes data "D0" to be provided to write drivers, for example the write drivers 286 in FIG. 2, between about 1.5 and 2 cycles after the "D0" data was first available as the dqin signal 302. Providing the "D0" data to the write drives is represented by the inflection point 387 in the din_e<7:0> signal 340.

In a process similar to that described above for the "D0" data, the "D1" data is processed by generation of a pulse 358 on the we_internal signal 304 during a time after time period (3e) but before the next trailing edge transition of the /WE signal 204 at time period (3f), generating a pulse 378 on the we_data signal 310 wherein at least the leading edge of pulse 378 occurs before time period (3f), and causing the "D1" data to be latched into a latch providing the DIN signal 324 output as represented in timing diagram 300 by inflection point 379.

At some time between time periods (3f) and (3g), a pulse, represented by pulse 388, is generated on the ltdata_o signal 338. Pulse 388 causes data "D1" to be provided to write drivers, for example the write drivers 286 in FIG. 2, between 1.5 and 2 cycles after the "D1" data was first available as the dqin signal 302. Providing the "D1" data to the write drives is represented by the inflection point 389 in the din_o<7:0> signal 342.

At time period (3f) a signal of "10H," followed by a signal at time period (3g) of "70H" is received on the DQ<7:0> signal 202. These signals, received in conjunction with the CLE signal 206 being high, indicate that the last of the data to be written to the memory array at the provided address has been provided to the DQ<7:0> input.

As shown in timing diagram 300, the we_internal signal 304 tracks the /WE signal 204 by always providing a pulse on the we_internal signal 304 following a time delay after a low to high transition of the /WE signal 204, but before the next low to high transition of the /WE signal 204. "Tracking" internally generated signals, such as the we_internal signal 304 to the /WE signal 204, is further described in conjunction with FIG. 4A and FIG. 4B.

Figure 4A:
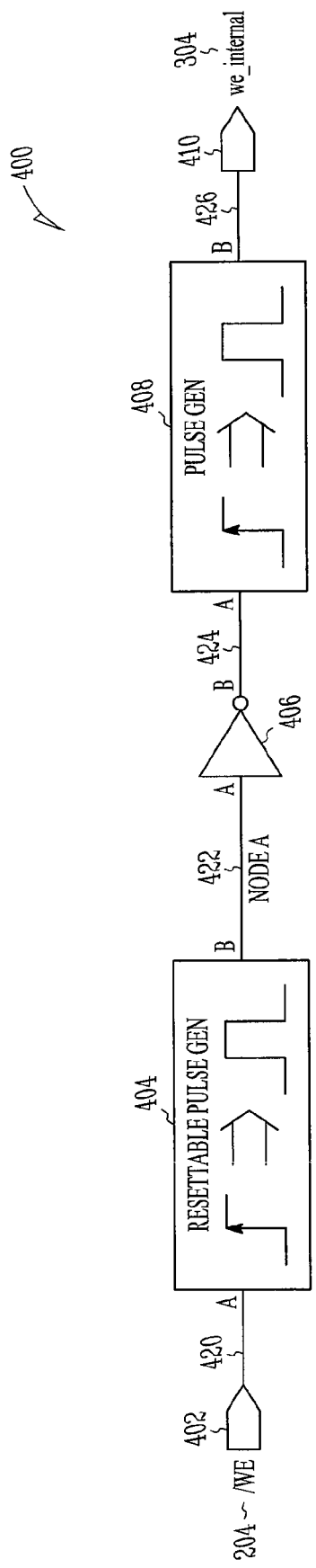
FIG. 4A is a functional block diagram of an apparatus according to various embodiments of the invention.

FIG. 4A illustrates a tracking circuit 400 for generating a we_internal signal 304 that tracks the external /WE signal 204. Tracking circuit 400 includes an input 402, a resettable pulse generator 404, an inverter 406, a pulse generator 408, and an output 410. Input 402 is coupled to an input 404a of the resettable pulse generator 404 through connection 420. The resettable pulse generator 404 includes an output 404b coupled to an input 406a of inverter 406 through connection 422. Connection 422 is also labeled as "Node A" in FIG. 4A. Inverter 406 includes an output 406b coupled to input 408a of the pulse generator 408 through connection 424. The pulse generator 408 includes an output 408b coupled to output 410 through connection 426.

Connections 420, 422, 424, and 426 are not limited to any particular type of connections. In various embodiments, connections 420, 422, 424, and 426 may be physical conductors, such as conductive traces formed as part of an integrated circuit, or optical conductors. Wireless and other types of connections are possible.

In addition, the resettable pulse generator 404, inverter 406, and the pulse generator 408 are not limited to any particular type of circuit. Any circuit capable of performing the functions described herein may be used. Circuits capable of provided a pulse signal, as well as resettably providing a pulse signal, are known to those of ordinary skill in the art. The resettable pulse generator 404 is "resettable" because when provided with a transition signal at an input to the resettable pulse generator 404, the pulse generator 404 will provide a single output pulse having a predetermined pulse width occurring for a time duration as long the state of the transition signal at the input remains at the state the input signal transitioned to when trigging the generation of the output pulse. However, if during the time duration of the output pulse the input transitions out of the state transitioned into initially, causing the output pulse, the output pulse will be terminated, and the output of the resettable pulse generator will return to the state the output signal would return to in the event the output pulse had completed its duration for the full predetermined time of the pulse.

Figure 4B:
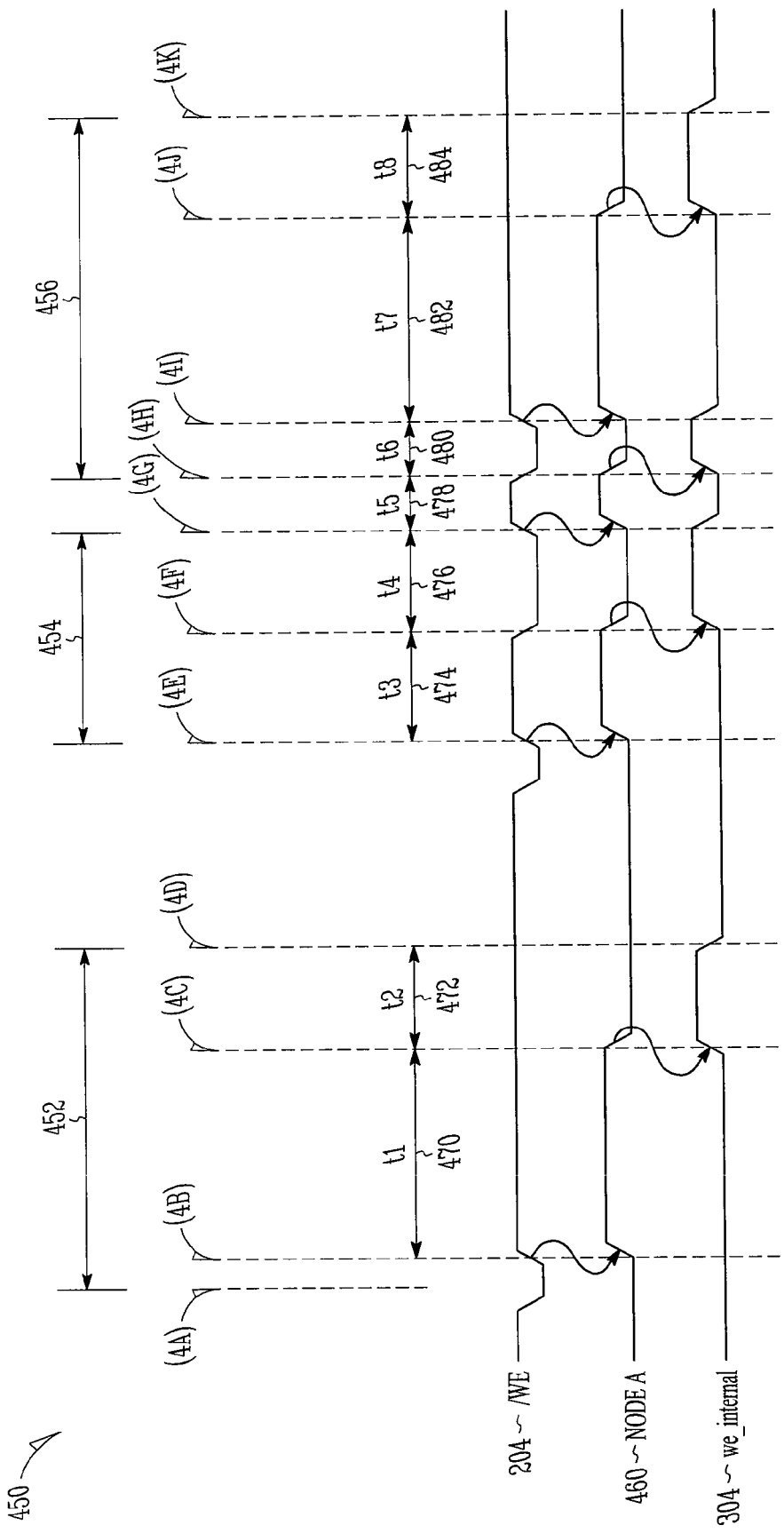
FIG. 4B is a timing diagram of waveforms according to the apparatus of FIG. 4A of the invention.

Tracking internally generated signals to an externally provided signal is further illustrated in FIG. 4B, which illustrates a timing diagram 450 for one or more embodiments of the invention. For the sake of illustration, timing diagram 450 will be discussed in view of the tracking circuit 400 of FIG. 4A, using a resettable pulse generator 404 having a predetermined pulse width of 20 nanoseconds, and a pulse generator 408 having a predetermined pulse width of 10 nanoseconds. However, various embodiments are not limited to a particular predetermined pulse width for either the resettable pulse generator 404 or the pulse generator 408, and such pulses may be longer or shorter than the 20 and 10 (as well as other) nanosecond widths described below.

As shown in FIG. 4A, a signal such as, but not limited to, the /WE signal 204 is applied to input 402 of tracking circuit 400, and a tracked signal is generated at output 410 of tracking circuit 400. Referring to FIG. 4B, a waveform representing /WE signal 204, a waveform representing a Node A signal 460 (present at Node A), and a waveform representing we_internal signal 304 are shown. A first portion of timing diagram 450 includes first time period 452, the second portion of timing diagram 450 includes second time period 454, and a third portion of timing diagram 450 includes third time period 456.

First time period 452 includes time periods (4a), (4b), (4c), and (4d). A pulse is received on the /WE signal 204 around and during the time periods of (4a) and (4b). At about time period (4b), a transition from low to high on the /WE signal 204 is provided to the resettable pulse generator 404. In response, the resettable pulse generator 404 provides a 20 nanosecond pulse, as shown by the pulse on Node A signal 460, between time periods (4b) and (4c), represented by time period $t_1$ 470.

At about time period (4c), the pulse at Node A signal 460 transitions from high to low. Because this signal at Node A is provided to the input of the pulse generator 408 through inverter 406 in FIG. 4A, a transition signal from low to high is received at input 408a of the pulse generator 408. This transition at the input 408a causes the pulse generator 408 to produce a 10 nanosecond output pulse at output 408b, represented by time period $t_2$ 472. The 10 nanosecond output pulse is in turn provided to output 410 of tracking circuit 400 as the we_internal signal 304. Thus, the we_internal signal 304 is tracking the /WE signal 204.

During first time period 452, the state of the /WE signal 204 remained high for at least the time period between time periods (4b) and (4c), represented by time period $t_1$ 470. Because the state of the /WE signal 204 remained high throughout time period $t_1$ 470, the resettable pulse generator 404 was not reset during the time period between time periods (4b) and (4c). Therefore, the duration of the time period between (4b) and (4d) was the maximum time period for the sum of the generated output pulses from resettable pulse generator 404 and pulse generator 408.

Second time period 454 includes time periods (4e), (4f), and (4g). A pulse is received on the /WE signal 204 before and around time period (4e). At about time period (4e), the transition from low to high on the /WE signal 204 is provided to the resettable pulse generator 404. In response, the resettable pulse generator 404 begins to provide a pulse, as shown by the pulse on Node A signal 460, represented by time period $t_3$ 474 between time periods (4e) and (4f). Without a reset, the duration of this pulse provided at Node A signal 460 would be 20 nanoseconds. However, at about time period (4f), the /WE signal 204 transitions from a high to a low state. This transition is provided to the input of resettable pulse generator 404. Because of this transition, the resettable pulse generator 404 is reset, causing the resettable pulse generator 404 to end the generated output pulse provided at output 404b. This is illustrated in FIG. 4B wherein Node A signal 460 transitions from high to low at about time period (4f).

As noted above, the high to low transition at the output of the resettable pulse generator 404 is coupled to the input of the pulse generator 408 through inverter 406. The transition at the input of the pulse generator 408 causes the pulse generator 408 to provide a 10 nanosecond output pulse as shown by the pulse on we_internal signal 304 between the time periods of (4f) and (4g). The 10 nanosecond pulse occurs during time period $t_4$ 476. At the conclusion of the output pulse from the pulse generator 408, the we_internal signal 304 returns to the low state at about time period (4g).

Because during the time between time periods (4e) and (4f) but less than the 20 nanosecond time period, the /WE signal 204 did not remain in the state transitioned to in initiating the generation of the we_internal signal 304 pulse, the time delay between the time when the initiation transition of the /WE signal 204 occurred and the start of the 10 nanosecond pulse provided by the pulse generator 408 was shortened to 10 nanoseconds instead of 20 nanoseconds, as represented by time period $t_3$ 474. Therefore, the we_internal signal 304 is also tracking the /WE signal 204 when the /WE signal does not remain in the state used to initiate the generation of the we_internal tracking pulse.

As further shown in FIG. 4B, time period $t_5$ 478 represents a five nanosecond time period between the end of we_internal pulse generated during time period $t_4$ 476 and the initiation of another pulse on the /WE signals 204 at about time period (4h).

Third time period 456 includes time periods (4h), (4i), (4j), and (4k). At a time around time periods (4h) and (4i), a pulse is received on the /WE signal 204. However, in this instance, the state of the /WE signal 204 remains high for at least the time period between time periods (4i) and (4j), represented by $t_7$ 482. This time period includes the time period of the full 20 nanosecond duration of the Node A signal 460 pulse. At about time period (4j) the full 20 nanosecond duration of the Node A signal 460 ends, triggering the pulse generator 408 to provide the 10 nanosecond pulse on we_internal signal 304 as described above and as represented by time period $t_8$ 484.

Thus, tracking by the we_internal signal 304 represents the same timing pattern during third time period 456 as was described for first time period 452, despite the fact that the previously generated we_internal pulse was generated after a shortened delay period following the initiation transition of the /WE signal 204.

Thus, the internally generated we_internal signal 304 is operable to track the /WE signal 204 both when the /WE signal does not interrupt the delayed generation of the we_internal signals 304, and when the /WE signal 204 does interrupt the delayed generation of the we_internal signal 304 pulse by proving a transition of the /WE signal 204 pulse before the full duration of the delay time period.

Referring again to FIG. 3, by generating the we_internal signal as a tracked signal for the /WE signal 204, the we_internal signal can be generated with a variable delay that tracks the /WE signal, but provides a pulse, causing the data in the dqin input to be moved to another latch before the data in the dqin latch is replaced by the next incoming data. The we_internal pulse can be used to generate the we_cmd pulse for moving the command signals from the dqin to the CMD latch as shown, for example, just before time period (3b). The we_internal pulse can be used to generate the we_add pulses for moving the address signals from the dqin to the ADD latch as shown, for example, just before time periods (3c) and (3d). The we_internal pulse can be used to generate the we_data pulses for moving the data signals from the dqin to the DIN Latch, as shown, for example, just before time periods (3e) and (3f).

In addition, the ltcmd signal 330 can be generated from the we_cmd signal 306 pulse, the ltadd1 signal 332 and ltadd2 signal 334 can be generated from the we_add signal 308 pulses, and the ltdata_e signal 336 and the ltdata_o signal 338 can be generated from the we_data signal 310 pulses. Thus, the internally generated signals used to control latching of data into the command register, the address register, and the data registers also track the /WE signal 204.

Figure 5:
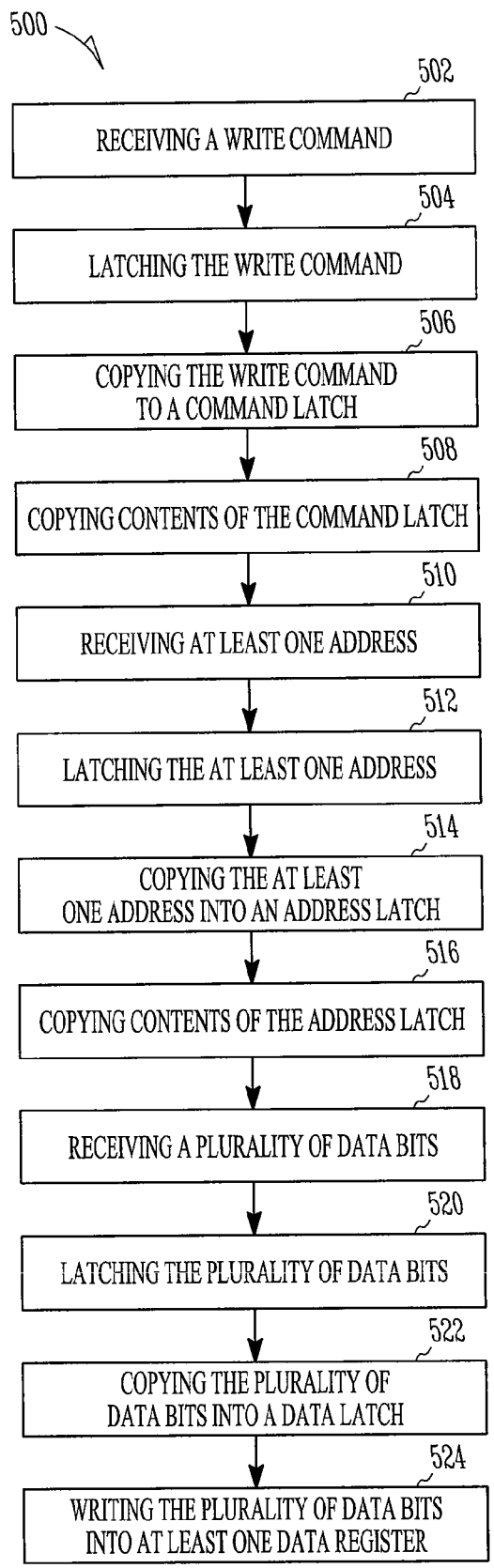
FIG. 5 is a flow diagram illustrating several methods according to various embodiments of the invention.

FIG. 5 is a flow diagram illustrating several methods according to various embodiments of the invention.

Method 500 may include at block 502 receiving a write command at an input of a flash memory, which may include receiving a write enable signal and a command latch enable signal.

Method 500 may include at block 504 latching the write command into a first latch, which may include latching the write command on a transition of the write enable signal.

Method 500 may include at block 506 copying the write command to a command latch, which may include generating a write command signal prior to receiving a first subsequent write enable signal at the flash memory, and transferring the write command to the command latch based on receiving the write command signal at the command latch. In some embodiments, copying the write command to the command latch includes at least partially decoding the write command to generate a decoded write command, and latching the decoded write command into a command register. In some embodiments, copying the write command to a command latch may include decoding the write command over a decoding time that is longer than a time period during which the write command is present in the first latch.

Method 500 may include at block 508 copying contents of the command latch to the command register, which may include generating an internal latch command signal and copying the contents of the command latch to the command register based on receiving the internal latch command signal at the command register.

Method 500 may include at block 510 receiving at least one address at the input of the flash memory, which may include receiving a write enable signal and an address latch enable signal.

Method 500 may include at block 512 latching the at least one address into the first latch, which may include latching successive addressed in the at least one address based on at least one successive transition of the write enable signal.

Method 500 may include at block 514 copying the at least one address into an address latch, which may include generating a write enable address signal prior to receiving a subsequent write enable signals at the flash memory, and transferring content in the first latch to the address latch based on the write enable address signal.

Method 500 may include at block 516 copying the at least one address in the address latch to an address register, which may include generating an internal address signal and copying the contents of the address latch to the address register based on receiving the internal address signal at the address register.

Method 500 may include at block 518 receiving a plurality of data bits at the input of the flash memory, which may include receiving a write enable signal while there is no command latch enable signal and no address latch enable signal present at the input of the flash memory.

Method 500 may include at block 520 latching the plurality of data bits into the first latch, which may include latching the plurality of data bits based on a transition of the write enable signal.

Method 500 may include at block 522 copying the plurality of data bits into a data latch, which may include generating a write enable data signal prior to receiving subsequent write enable signals at the flash memory, and transferring a contents of the first latch into the data latch based on the write enable data signal.

Method 500 may include at block 524 writing the plurality of data bits into at least one data register included in the flash memory which may include generation of an internal data signal, and providing the plurality of data bits to one or more write drivers based on receiving the internal data signal at the write drivers.

Figure 6:
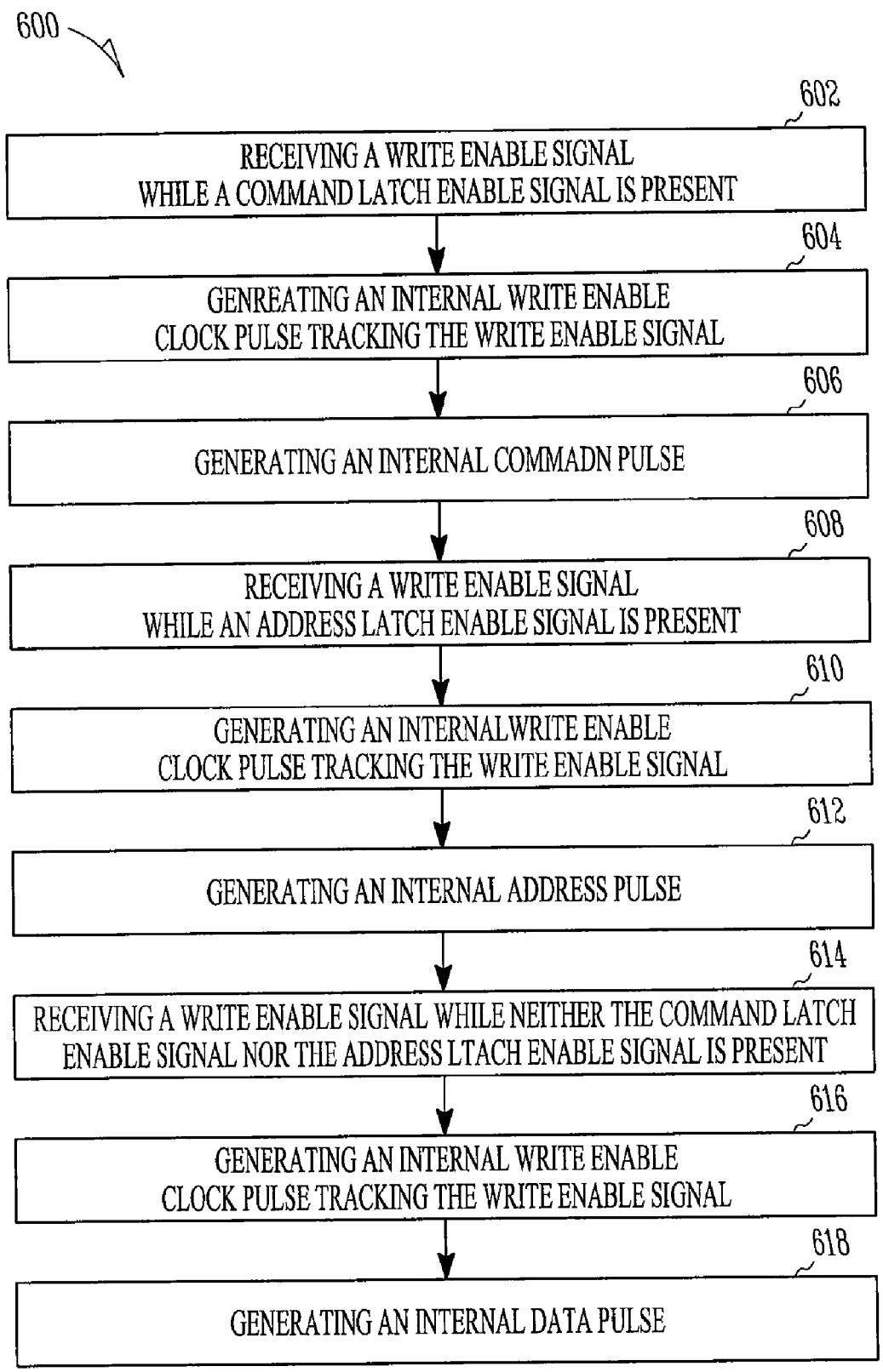
FIG. 6 is a flow diagram illustrating several methods according to various embodiments of the invention.

FIG. 6 is a flow diagram illustrating several methods according to various embodiments of the invention.

Method 600 may include at block 602 receiving a write enable signal while a command latch enable signal is present on at least one input to the flash memory, which may include latching the command latch enable signal to provide a latched command latch enable signal. Embodiments may include providing the write enable signal to an enable input of an input latch coupled to a data input.

Method 600 may include at block 604 generating an internal write enable clock pulse tracking the write enable signal received while the command latch enable signal is present, and generating a write enable command pulse from the internal write enable clock pulse. Embodiments may include providing the write enable command pulse to at least one command latch. Embodiments may include generating a plurality of individually controlled write enable command pulses, and providing the plurality of individually controlled write enable command pulses individually to a plurality of command latches. Embodiments may include providing the plurality of individually controlled write enable command pulses to a plurality of command latches operating in a parallel fashion. Embodiments may include providing the plurality of individually controlled write enable command pulses to a plurality of command latches operating in a serial fashion. Embodiments may include providing a plurality of individually controlled write enable command pulses to one or more of the plurality of command latches at different times.

Method 600 may include at block 606 generating an internal command pulse, which may include generating the internal command pulse at some time after providing the write enable command pulse to the at least one command latch. Embodiments may include providing the internal command pulse to a command register coupled to the at least one command latch.

Method 600 may include at block 608 receiving a write enable signal while an address latch enable signal is present on at least one input to the flash memory, which may include latching the address latch enable signal to provide a latched address latch enable signal. Embodiments may include providing the write enable signal to an enable input of the input latch coupled to the data input.

Method 600 may include at block 610 generating an internal write enable clock pulse tracking the write enable signal received while the address latch enable signal is present, and generating a write enable address pulse from the internal write enable clock pulse. Embodiments may include providing the write enable address pulse to at least one address latch. Embodiments may include generating a plurality of individually controlled write enable address pulses, and providing the plurality of individually controlled write enable address pulses individually to a plurality of address latches.

Embodiments may include at block 610 receiving at least one subsequent write enable signal while the address latch enable signal is present at the at least one input of the flash memory, generating at least one subsequent internal write enable clock pulse to track a corresponding at least one subsequent write enable signal, generating a subsequent write enable address pulse for each of the generated at least one subsequent internal write enable clock pulses, and generating at least one subsequent internal address pulse after a time period that begins after a corresponding one of the at least one subsequent write enable address pulses has been generated.

Method 600 may include at block 612 generating an internal address pulse, which may include generating the internal address pulse at some time after providing the write enable address pulse to the at least one address latch. Embodiments may include providing the internal address pulse to an address register coupled to the at least one address latch.

Method 600 may include at block 614 receiving a write enable signal while neither the command latch enable signal nor the address latch enable signal is present on the at least one input to the flash memory, which may include latching the write enable signal to provide a latched data latch enable signal. Embodiments may include providing the write enable signal to an enable input of the input latch coupled to the data input.

Method 600 may include at block 616 generating an internal write enable clock pulse tracking the write enable signal received while neither the command latch enable signal nor the address latch enable signal were present, and generating a write enable data pulse from the internal write enable clock pulse. Embodiments may include providing the write enable data pulse to at least one data latch. Embodiments may include generating a plurality of individually controlled write enable data pulses, and providing the plurality of individually controlled write enable data pulses individually to a plurality of data latches.

Embodiments may include at block 616 receiving at least one subsequent write enable signal while neither the command latch enable signal nor the address latch enable signal are present at the at least one input of the flash memory, generating at least one subsequent internal write enable clock pulse to track a corresponding at least one subsequent write enable signal, generating a subsequent write enable data pulse for each of the generated at least one subsequent internal write enable clock pulses; and generating at least one subsequent internal data pulse after a corresponding one of the at least one subsequent write enable data pulses has been generated.

Method 600 may include at block 618 generating an internal data pulse, which may include generating the internal data pulse at some time after providing the write enable data pulse to the at least one data latch. Embodiments may include providing the internal data pulse to at least one write driver coupled to the at least one data latch.

The accompanying drawings that form a part hereof show, by way of illustration and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims and the full range of equivalents to which such claims are entitled.

Such embodiments of the inventive subject matter may be referred to herein individually or collectively by the term "invention" merely for convenience and without intending to voluntarily limit the scope of this application to any single invention or inventive concept, if more than one is in fact disclosed. Thus, although specific embodiments have been illustrated and described herein, any arrangement calculated to achieve the same purpose may be substituted for the specific embodiments shown. This disclosure is intended to cover any and all adaptations or variations of various embodiments. Combinations of the above embodiments and other embodiments not specifically described herein will be apparent to those of skill in the art upon reviewing the above description.

Voltage magnitudes for "low" logic signals and "high" logic signals are normally not defined since they can have a variety of relative values including negative voltages and positive voltages. "High" and "low" logic signals are defined only by their relationship to one another in representing binary values. Typically, a "high" logic signal has a voltage level or potential higher than a "low" logic signal, or the "low" signal may have a different polarity or negative polarity than the "high" signal. As those skilled in the art well understand, in some logic systems, a "high" logic value may even be represented by a ground potential when the relative "low" logic value is represented by a negative voltage potential in reference to ground.

The Abstract of the Disclosure is provided to comply with 37 C.F.R. §1.72(b) requiring an abstract that will allow the reader to quickly ascertain the nature of the technical disclosure. It is submitted with the understanding that it will not be used to interpret or limit the scope or meaning of the claims. In the foregoing Detailed Description, various features are grouped together in a single embodiment for the purpose of streamlining the disclosure. This method of disclosure is not to be interpreted to require more features than are expressly recited in each claim. Rather, inventive subject matter may be found in less than all features of a single disclosed embodiment. Thus the following claims are hereby incorporated into the Detailed Description, with each claim standing on its own as a separate embodiment.

CONCLUSION

An external clock tracking pipelined command/address/data latch scheme has been described herein. The pipeline may include a command latch, an address latch, and a data latch coupled to an input latch. The command latch, the address latch, and the data latch provide a storage mechanism for moving serial data signals received at an input latch to these pipelined latches before the next incoming data overwrites the data just received at the input latch. Since the serial data received at the input latch can be received sequentially on each incoming clock cycle, moving the data to the additional latches allows incoming data to be received at rates that exceed the rate at which the data might initially processed. Thus, a faster clock rate may be used with a pipelined latch scheme without delaying the input of serial data. The data movement and the latching of data into additional latches is controlled using a plurality of internally generated clock signals. These internally generated clock signals can be made to track the external clock signal used to sequentially clock in the serial data. Thus, control of the pipelined latch scheme may be adjusted to coordinate latching the serial data to the rate at which the clock signal is providing the serial data to a memory device for storage into the memory array.

What is claimed is:

1. A flash memory comprising:
an internal clock control generator including a first input to receive an externally generated write enable signal, and a first output operable to provide an internally generated write enable signal that tracks the externally generated write enable signal by providing an internally generated write enable clock pulse at some time after a given signal level transition at the first input and before the next consecutive same signal level transition at the first input, the internal clock control generator including a tracking circuit, the tracking circuit including a resettable pulse generator coupled to a second pulse generator, the resettable pulse generator having an input coupled to the first input and including a resettable pulse generator output coupled to a node, the second pulse generator including an input coupled to the node and a second pulse generator output coupled to the first output.

2. The flash memory of claim 1, wherein the resettable pulse generator includes circuitry operable to provide a single output pulse having a predetermined pulse width occurring for a time duration and as long as the state of a transition signal at the input to the resettable pulse generator remains at the state the transition signal transitions to when triggering the generation of the single output pulse.

3. The flash memory of claim 2, wherein the predetermined pulse width is 20 nanoseconds.

4. The flash memory of claim 2, wherein the transition signal is the externally generated write enable signal.

5. The flash memory of claim 2, wherein the resettable pulse generator includes circuitry operable to terminate the single output pulse and return the output of the resettable pulse generator to the state the output would be in had the duration of the predetermined pulse width been completed if, during the duration of the single output pulse, the state of the transition signal at the input to the resettable pulse generator transitions out of the state transitioned into to cause the generation of the single output pulse.

6. The flash memory of claim 1, wherein the second pulse generator includes circuitry operable to provide a second single output pulse having a predetermined pulse width, the second single output pulse initiated by a particular transition of a signal level at the input to the second pulse generator.

7. The flash memory of claim 6, wherein the particular transition at the input of the second pulse generator is provided by a transition in a signal level at the node coupled to the resettable pulse generator output, the particular transition occurring at the end of the single output pulse provided at the resettable pulse generator output.

8. The flash memory of claim 6, wherein the second single output pulse provided by the second pulse generator is the internally generated write enable signal provided by the internal clock control generator.

9. The flash memory of claim 1, wherein the output of the resettable pulse generator is coupled to the input of the second pulse generator through an inverter.

10. The flash memory of claim 1, wherein the internal clock control generator further includes:
a second input to receive an externally generated command latch enable signal, and a write enable command signal output operable to provide a write enable command signal pulse, the internal clock control generator operable to receive the given signal level transition at the first input and at the same time to be receiving the externally generated command latch enable signal at the second input,
and in response, the tracking circuit is operable to generate a pulse on the internally generated write enable signal that tracks the given signal level transition at the first input, and to further generate a write enable command signal pulse at the write enable command signal output based on the internally generated write enable signal.

11. The flash memory of claim 10, wherein at least the leading edge of the write enable command signal pulse occurs before a time when a next consecutive given signal level transition occurs a the first input following the given signal level transition at the first input.

12. The flash memory of claim 11, the internal clock control generator further including:
an internal latch command output operable to provide an latch command signal pulse; and
a one shot circuit operable to generate the latch command signal pulse at some time following the occurrence of the write enable command signal pulse, the one shot circuit operable to provide the latch command signal pulse to the internal latch command output following the occurrence of the write enable command signal pulse and during a time period between the next consecutive given transition at the first input and a second and following next consecutive given transition at the first input.

13. A method comprising:
receiving at an input to a flash memory an externally generated write enable signal including a sequence of a plurality of signal level transitions from a first signal level to a second signal level;
generating, in response to each of the plurality of signal level transitions, an internally generated write enable signal pulse that tracks the particular one of the plurality of signal level transitions that the internally generated write enable signal pulse is being generated in response to,
wherein generating the internally generated write enable signal pulse includes generating a pulse having a predetermined pulse width occurring for a time duration and as long as the state of the externally generated write enable signal remains at the second signal level during the time duration of the predetermined pulse width.

14. The method of claim 13, wherein generating the internally generated write enable signal pulse includes:
applying the externally generated write enable signal to an input of a resettable pulse generator;
triggering the resettable pulse generator to provide a resettable output pulse at an output of the resettable pulse generator based on receiving at an input to the resettable pulse generator a signal level transition from the first signal level to the second signal level on the externally generated write enable signal.

15. The method of claim 14, including:
terminating the time duration of the resettable output pulse if the signal level at the input to the resettable pulse generator transitions from the second signal level to the first signal level during the time the resettable pulse generator is providing the resettable output pulse at the output of the resettable pulse generator.

16. The method of claim 15, including:
providing the resettable output pulse to an input of a second pulse generator;
triggering, based on an ending transition of the resettable output pulse, the second pulse generator to provide a second output pulse having a second predetermined duration, the second output pulse provided as the internally generated write enable signal pulse.

17. The method of claim 13, including:
receiving command data at an input latch in the flash memory;
while the command data is still present at the input latch, receiving the signal level transition at the input associated with the externally generated write enable signal;
in response, generating an internally generated write enable signal pulse tracking the externally generated write enable signal;
generating a internally generated write command signal pulse based on the in response to the internally generated write enable signal pulse;
providing the internally generated write command signal pulse to a command latch; and
latching the command data from the input latch into the command latch in response to the command latch receiving the internally generated write command signal pulse.

18. The method of claim 17, including:
generating a latch command signal pulse at a time period following the generation of the internally generated write command signal pulse; and latching the command data from the command latch into a command register in the flash memory in response to the latch command signal pulse.

19. A system comprising:
   a processor;
   a flash memory coupled to the processor, the flash memory including a set of pipelined latches including at least one command latch coupled to a data input, at least one address latch coupled to the data input, and at least one data latch coupled to the data input; and
   an internal clock control generator coupled to a first input including an externally generated write enable signal input, the internal clock control generator coupled to the at least one command latch, to the at least one address latch, and to the at least one data latch,
   the internal clock control generator including a tracking circuit including a resettable pulse generator having an input coupled to the externally generated write enable signal input and having a resettable pulse generator output coupled to a node, and a second pulse generator having an input coupled to the node and having a second pulse generator output operable to provide internally generated write enable clock pulses that track each of a plurality of externally generated write enable signal pulses received at the input to the internal clock control generator,
   wherein each of the internally generated write enable clock pulses track a particular one of the externally generated write enable signal pulses.

20. The system of claim 19, wherein the resettable pulse generator includes circuitry operable to provide a single output pulse having a predetermined pulse width occurring for a time duration and as long as a state of a transition signal at the input to the resettable pulse generator remains at the same state the transition signal transitioned to when triggering the generation of the single output pulse.

21. The system of claim 19, wherein the internal clock control generator further includes:
   a second input to receive an externally generated command latch enable signal; and
   a write enable command signal output operable to provide a write enable command signal pulse, the internal clock control generator operable to receive a given signal level transition at the first input and at the same time to be receiving the externally generated command latch enable signal at the second input,
   and in response, the tracking circuit is operable to generate an internally generated write enable clock pulse that tracks the given signal level transition at the first input, and to further generate a write enable command pulse at the write enable command signal output based on the internally generated write enable clock pulse, the write enable command signal output coupled to the at least one command latch and causing command data present at the input latch to be latched into the at least one command latch.

22. The system of claim 19, wherein the internal clock control generator further includes:
   a third input to receive an externally generated address latch enable signal, and
   a write enable address signal output operable to provide a write enable address signal pulse, the internal clock control generator operable to receive a given signal level transition at the first input and at the same time to be receiving the externally generated address latch enable signal at the third input,
   and in response, the tracking circuit is operable to generate an internally generated write enable clock pulse that tracks the given signal level transition at the first input, and to further generate a write enable address pulse at the write enable address signal output based on the internally generated write enable clock pulse, the write enable address signal output coupled to the at least one address latch and causing address data present at the input latch to be latched into the at least one address latch.

23. The system of claim 19, wherein the internal clock control generator further includes:
   a write enable data signal output operable to provide a write enable data signal pulse, the internal clock control generator operable to receive a given signal level transition at the first input and at the same time to be determine that no signal is present at a command latch enable input to the flash memory and that no signal is present at an address latch enable input to the flash memory,
   and in response, the tracking circuit is operable to generate an internally generated write enable clock pulse that tracks the given signal level transition at the first input, and to further generate a write enable data pulse at the write enable data signal output based on the internally generated write enable clock pulse, the write enable data signal output coupled to the at least one data latch and causing data present at the input latch to be latched into the at least one data latch.

* * * * *

UNITED STATES PATENT AND TRADEMARK OFFICE
CERTIFICATE OF CORRECTION

| | | |
|---|---|---|
| PATENT NO. | : 7,609,565 B2 | Page 1 of 1 |
| APPLICATION NO. | : 12/330285 | |
| DATED | : October 27, 2009 | |
| INVENTOR(S) | : June Lee | |

It is certified that error appears in the above-identified patent and that said Letters Patent is hereby corrected as shown below:

In column 21, line 56, in Claim 11, delete "a" and insert -- at --, therefor.

Signed and Sealed this

Nineteenth Day of January, 2010

David J. Kappos
*Director of the United States Patent and Trademark Office*